United States Patent
Kawamura et al.

(10) Patent No.: US 11,074,964 B1
(45) Date of Patent: Jul. 27, 2021

(54) INTEGRATED ASSEMBLIES COMPRISING DIGIT LINES CONFIGURED TO HAVE SHUNTED ENDS DURING A PRECHARGE OPERATION

(71) Applicant: Micron Technology, Inc., Boise, ID (US)

(72) Inventors: Christopher J. Kawamura, Tokyo (JP); Jiyun Li, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/825,041

(22) Filed: Mar. 20, 2020

(51) Int. Cl.
*G11C 5/10* (2006.01)
*G11C 11/4094* (2006.01)
*G11C 11/408* (2006.01)
*G11C 11/4091* (2006.01)

(52) U.S. Cl.
CPC .......... *G11C 11/4094* (2013.01); *G11C 5/10* (2013.01); *G11C 11/4085* (2013.01); *G11C 11/4091* (2013.01)

(58) Field of Classification Search
CPC .......... G11C 11/4094; G11C 11/4091; G11C 11/4085; G11C 5/10
See application file for complete search history.

(56) References Cited

U.S. PATENT DOCUMENTS

| | | | | |
|---|---|---|---|---|
| 5,021,998 | A * | 6/1991 | Suzuki | H01L 27/10808 257/E27.086 |
| 5,654,933 | A * | 8/1997 | McLaury | G11C 7/1075 365/190 |
| 5,657,266 | A * | 8/1997 | McLaury | G11C 7/103 365/149 |
| 6,317,368 | B1 * | 11/2001 | Taito | G11C 16/3468 365/189.11 |
| 6,477,079 | B2 * | 11/2002 | Kaneko | G11C 7/06 365/149 |
| 6,532,167 | B2 * | 3/2003 | Kaneko | G11C 7/06 365/149 |
| 10,482,931 | B1 * | 11/2019 | Miyatake | G11C 7/12 |
| 2006/0171223 | A1 * | 8/2006 | Kim | G11C 7/12 365/203 |
| 2018/0218765 | A1 * | 8/2018 | Derner | G11C 11/4097 |

(Continued)

*Primary Examiner* — Mushfique Siddique
(74) *Attorney, Agent, or Firm* — Wells St. John P.S.

(57) ABSTRACT

Some embodiments include an integrated assembly having a first digit line coupled with SENSE AMPLIFIER circuitry. The first digit line has a first region distal from the SENSE AMPLIFIER circuitry. A second digit line is coupled with the SENSE AMPLIFIER circuitry and has a second region distal from the SENSE AMPLIFIER circuitry. PRE-CHARGE circuitry includes one or more first equalization transistors proximate the first and second regions, and includes a second equalization transistor proximate the SENSE AMPLIFIER circuitry. Some embodiments include an integrated assembly having a first digit line coupled with SENSE AMPLIFIER circuitry. The first digit line has a first region distal from the SENSE AMPLIFIER circuitry. A second digit line is coupled with the SENSE AMPLIFIER circuitry and has a second region distal from the SENSE AMPLIFIER circuitry. PRECHARGE circuitry includes an electrical connection coupling the first and second regions to one another.

28 Claims, 9 Drawing Sheets

(56) References Cited

U.S. PATENT DOCUMENTS

| | | | | |
|---|---|---|---|---|
| 2018/0268890 A1* | 9/2018 | Gupta | ................... | G11C 11/405 |
| 2019/0043595 A1* | 2/2019 | Vimercati | ............. | G11C 11/221 |
| 2020/0051613 A1* | 2/2020 | Derner | ................... | G11C 5/025 |
| 2020/0066327 A1* | 2/2020 | Derner | ................ | G11C 11/4097 |
| 2020/0402563 A1* | 12/2020 | Guo | ................... | G11C 11/2273 |
| 2021/0028308 A1* | 1/2021 | Simsek-Ege | ........ | G11C 11/4091 |

\* cited by examiner

INTEGRATED ASSEMBLIES COMPRISING DIGIT LINES CONFIGURED TO HAVE SHUNTED ENDS DURING A PRECHARGE OPERATION

TECHNICAL FIELD

Memory arrays (e.g., DRAM arrays). Integrated assemblies comprising vertically-stacked decks. Integrated assemblies comprising complementary digit lines configured to have shunted ends during a precharge operation.

BACKGROUND

Memory is utilized in modern computing architectures for storing data. One type of memory is Dynamic Random-Access Memory (DRAM). DRAM may provide advantages of structural simplicity, low cost and high speed in comparison to alternative types of memory.

DRAM may utilize memory cells which have one capacitor in combination with one transistor (so-called 1T-1C memory cells), with the capacitor being coupled with a source/drain region of the transistor. An example 1T-1C memory cell 2 is shown in FIG. 1, with the transistor labeled T and the capacitor labeled C. The capacitor has one node coupled with a source/drain region of the transistor, and another node coupled with a common plate, CP. The common plate may be coupled with any suitable voltage, such as a voltage within a range of from greater than or equal to ground to less than or equal to VCC (i.e., ground≤CP≤VCC). In some applications, the common plate is at a voltage of about one-half VCC (i.e., about VCC/2). The transistor has a gate coupled to a wordline WL (i.e., access line, routing line, first linear structure, etc.), and has a source/drain region coupled to a bitline BL (i.e., digit line, sense line, second linear structure, etc.). In operation, an electrical field generated by voltage along the wordline may gatedly couple the bitline to the capacitor during read/write operations.

Another prior art 1T-1C memory cell configuration is shown in FIG. 2. The configuration of FIG. 2 shows two memory cells 2a and 2b; with the memory cell 2a comprising a transistor T1 and a capacitor C1, and with the memory cell 2b comprising a transistor T2 and a capacitor C2. Wordlines WL0* and WL1 are electrically coupled with the gates of transistors T1 and T2, respectively. A connection to a bitline BL is shared by the memory cells 2a and 2b.

The memory cells described above may be incorporated into memory arrays, and in some applications the memory arrays may have open bitline arrangements. An example integrated assembly 9 having open bitline architecture is shown in FIG. 3. The assembly 9 includes two laterally adjacent memory arrays ("ARRAY-1" and "ARRAY-2"), with each of the arrays including memory cells of the type described in FIG. 2 (not labeled in FIG. 3 to simplify the drawing). Wordlines WL0-WL7 extend across the arrays, and are coupled with wordline drivers. Digit lines D0-D8 are associated with the first array (ARRAY-1), and digit lines D0*-D8* are associated with the second array (ARRAY-2). Sense amplifiers SA0-SA8 are provided between the first and second arrays. Digit lines at the same height are paired within one another and compared through a sense amplifier (e.g., digit lines D0 and D0* are paired with one another and compared with the sense amplifier SA0). In a read operation, one of the paired digit lines may serve as a reference in determining electrical properties (e.g., voltage) of the other of the paired digit lines.

A continuing goal of integrated circuit fabrication is to increase packing density and to thereby increase the level of integration. It would be desirable to develop three-dimensional arrangements having tightly packed memory. Another continuing goal is to rapidly read/write from/to memory cells of a memory array. A limitation on the speed of a READ/WRITE operation may be the speed at which a digit line can be precharged during the initiation of a READ/WRITE sequence. It would be desirable to improve the speed of PRECHARGE operations.

DETAILED DESCRIPTION OF THE ILLUSTRATED EMBODIMENTS

Some embodiments include integrated assemblies having digit lines extending along columns of memory cells. Paired digit lines may be comparatively coupled through SENSE AMPLIFIER circuitry. The paired digit lines may have first ends coupled with the SENSE AMPLIFIER circuitry, and may have second ends distal from the first ends. The second ends may be coupled to one another through PRECHARGE circuitry to speed a PRECHARGE operation. Persons of ordinary skill will understand that a PRECHARGE operation is a stage during which selected digit lines are driven to a desired voltage intermediate between the high-voltage associated with a first memory state and the low-voltage associated with a second memory state. Typically, the PRECHARGE operation will drive the selected digit lines to a voltage of VCC/2, where VCC is a high supply state voltage (as compared to VSS, which is the low supply state voltage). The PRECHARGE operation generally precedes the sensing of memory states during a READ operation and/or the programming of memory states during a WRITE operation.

In some applications, SENSE AMPLIFIER circuitry and WORDLINE DRIVER circuitry may be provided under the memory cells. The SENSE AMPLIFIER circuitry may be broken amongst multiple blocks (subunits) under the memory cells, and similarly the WORDLINE DRIVER circuitry may be broken amongst multiple blocks (subunits) under the memory cells. The blocks (subunits) of the SENSE AMPLIFIER circuitry and the WORDLINE DRIVER circuitry may be considered to form a quilt pattern. Example embodiments are described with reference to FIGS. 4-9.

Figure 4:
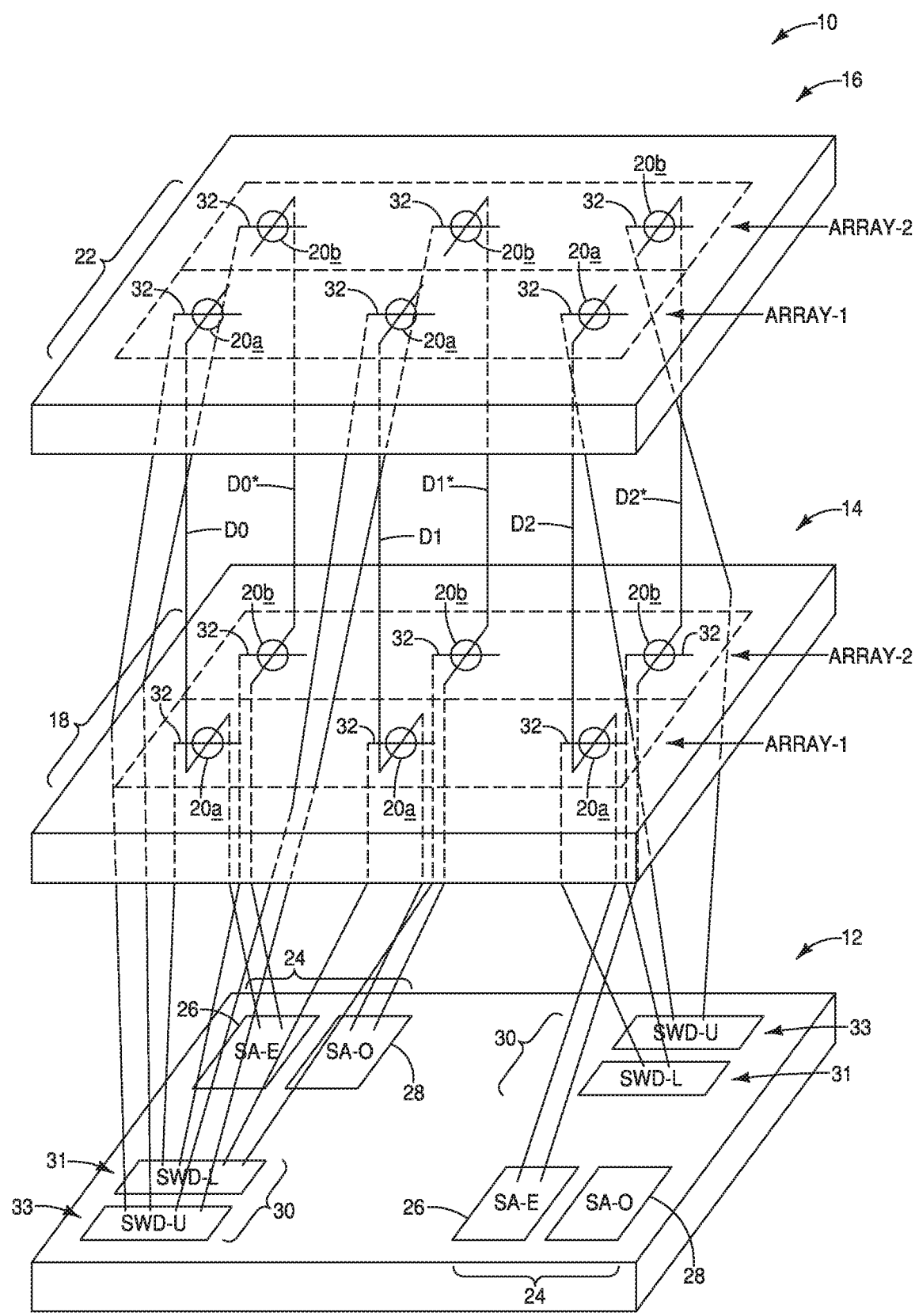
FIG. 4 is a schematic diagram of an example integrated assembly having multiple decks which are vertically displaced relative to one another.

Referring to FIG. 4, an integrated assembly 10 includes a base 12, a first deck 14 over the base, and a second deck 16 over the first deck. The structures 12, 14 and 16 are vertically stacked one atop another. The base 12, first deck 14 and second deck 16 may be considered to be examples of levels that are stacked one atop the other. The levels may be within different semiconductor dies, or at least two of the levels may be within the same semiconductor die.

Figure 1:
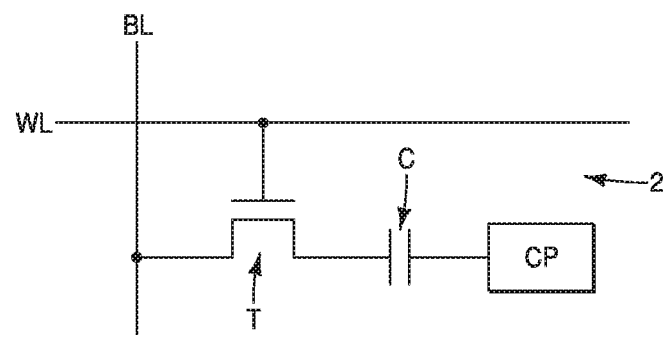
FIG. 1 is a schematic diagram of a prior art memory cell having 1 transistor and 1 capacitor.
Figure 2:
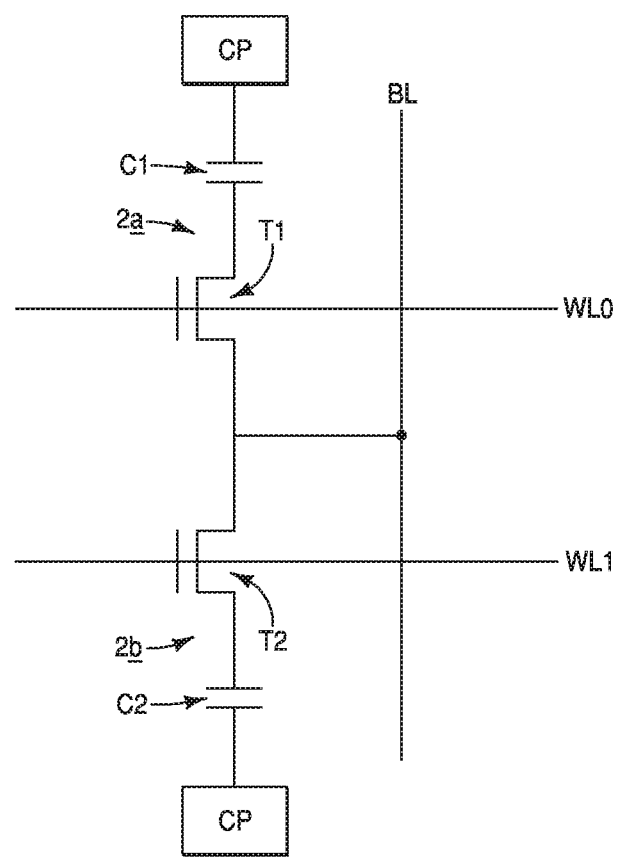
FIG. 2 is a schematic diagram of a pair of prior art memory cells which each have 1 transistor and 1 capacitor, and which share a bitline connection.
Figure 3:
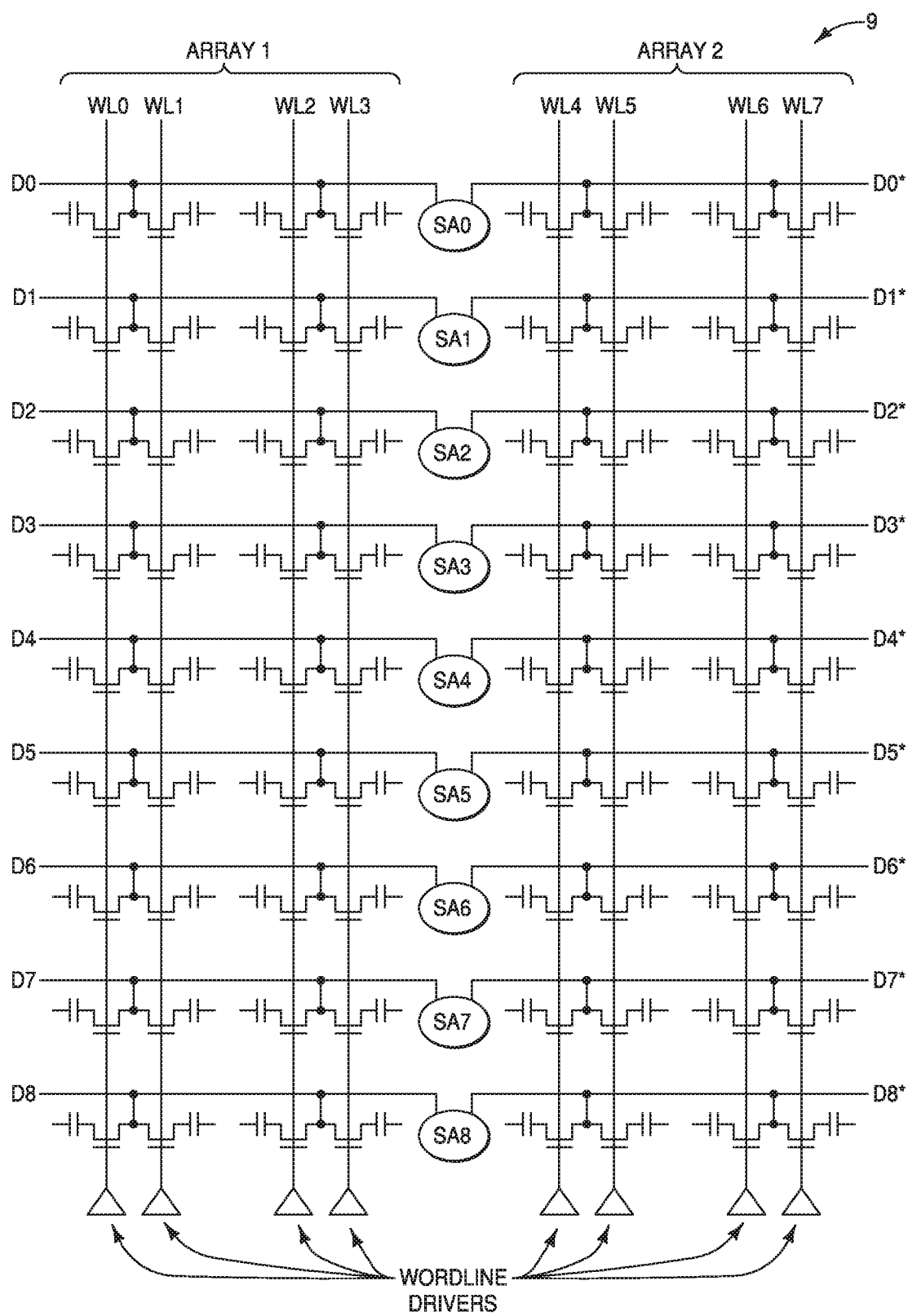
FIG. 3 is a schematic diagram of a prior art integrated assembly having open bitline architecture.

The first and second decks 14 and 16 have memory regions 18 and 22, respectively. First and second memory arrays (ARRAY-1 and ARRAY-2 analogous to those of FIG. 3) are supported by the first and second decks 14 and 16, with each of the memory arrays having a first portion along the first (lower) deck 14 and a second portion along the second (upper) deck 16. The first memory array includes first memory cells 20a, and the second memory array includes second memory cells 20b. The memory cells are diagrammatically illustrated as circles. The first and second memory arrays may comprise any suitable number of memory cells, and in some embodiments may comprise hundreds, thousands, millions, etc., of memory cells. The memory cells may be DRAM cells, and in some embodiments may be configured in arrangements of the types described above with reference to prior art FIGS. 1-3 (i.e., ARRAY-1 and ARRAY-2 may be DRAM arrays).

In some embodiments, the first and second decks 14 and 16 may be referred to as first and second memory decks, respectively.

The base 12 may comprise semiconductor material; and may, for example, comprise, consist essentially of, or consist of monocrystalline silicon. The base 12 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 12 may correspond to a semiconductor substrate containing one or more materials associated with integrated circuit fabrication. Such materials may include, for example, one or more of refractory metal materials, barrier materials, diffusion materials, insulator materials, etc. Each of the decks 14 and 16 may also comprise semiconductor material.

In the shown embodiment, the base 12 comprises SENSE AMPLIFIER circuitry (SA), and WORDLINE DRIVER circuitry (WD).

The SENSE AMPLIFIER circuitry includes regions labeled "SA-E" to identify them as being associated with an "even" portion of a circuit, and regions labeled "SA-O" to identify them as being associated with an "odd" portion of a circuit. The terms "even" and "odd" are arbitrary, and are utilized to distinguish the different SENSE AMPLIFIER circuitries from one another. The illustrated configuration has the SENSE AMPLIFIER circuitries SA-O and SA-E paired with one another and distributed as structures (blocks) 24.

The WORDLINE DRIVER circuitry (i.e., row-driver circuitry) includes regions 31 labeled SWD-L, and regions 33 labeled SWD-U. The acronym SWD stands for sub-wordline-driver, and is utilized to emphasize that the components SWD-L and SWD-U are portions of the general WORDLINE DRIVER circuitry. The WORDLINE DRIVER circuitries SWD-L are utilized during operation of the memory cells associated with the lower deck 14, and the WORDLINE DRIVER circuitries SWD-U are utilized during operation of the memory cells associated with the upper deck 16.

The illustrated configuration has the WORDLINE DRIVER circuitries SWD-L and SWD-U paired with one another and distributed as structures (blocks) 30.

The blocks 24 and 30 may be considered to form patch regions. The patch regions may be considered together to form a quilted arrangement of the circuit subunits along the base 12.

First digit lines D0, D1 and D2 are associated with the first memory array (ARRAY-1). The first digit lines D0, D1 and D2 extend along the first memory array (ARRAY-1) and are coupled with first memory cells 20a of the first memory array. The digit lines D0, D1 and D2 are laterally spaced from one another, and may be representative of a large number of substantially identical digit lines extending across the first memory array; with the term "substantially identical" meaning identical to within reasonable tolerances of fabrication and measurement. The first digit lines alternate between even first digit lines and odd first digit lines, with the digit lines D0 and D2 being representative of even first digit lines, and the digit line D1 being representative of an odd first digit line. The even first digit lines (e.g., D0) are coupled with the first SENSE AMPLIFIER circuitry 26 (i.e., SA-E), and the odd first digit lines (e.g., D1) are coupled with the second SENSE AMPLIFIER circuitry 28 (i.e., SA-O). The first digit lines D0, D1 and D2 have first portions along the first deck 14, and have second portions along the second deck 16.

Second digit lines D0*, D1* and D2* are associated with the second memory array (ARRAY-2). The second digit lines D0*, D1* and D2* extend along the second memory array and are coupled with second memory cells 20b of the second memory array (ARRAY-2). The digit lines D0*, D1* and D2* are laterally spaced from one another, and may be representative of a large number of substantially identical digit lines extending across the second memory array. The second digit lines alternate between even second digit lines and odd second digit lines, with the digit lines D0* and D2* being representative of even second digit lines, and the digit line D1* being representative of an odd second digit line. The even second digit lines (e.g., D0*) are coupled with the first SENSE AMPLIFIER circuitry 26 (SA-E), and the odd second digit lines (e.g., D1*) are coupled with the second SENSE AMPLIFIER circuitry 28 (SA-O). The second digit lines D0*, D1* and D2* have first portions along the first deck 14, and have second portions along the second deck 16.

Figure 8:
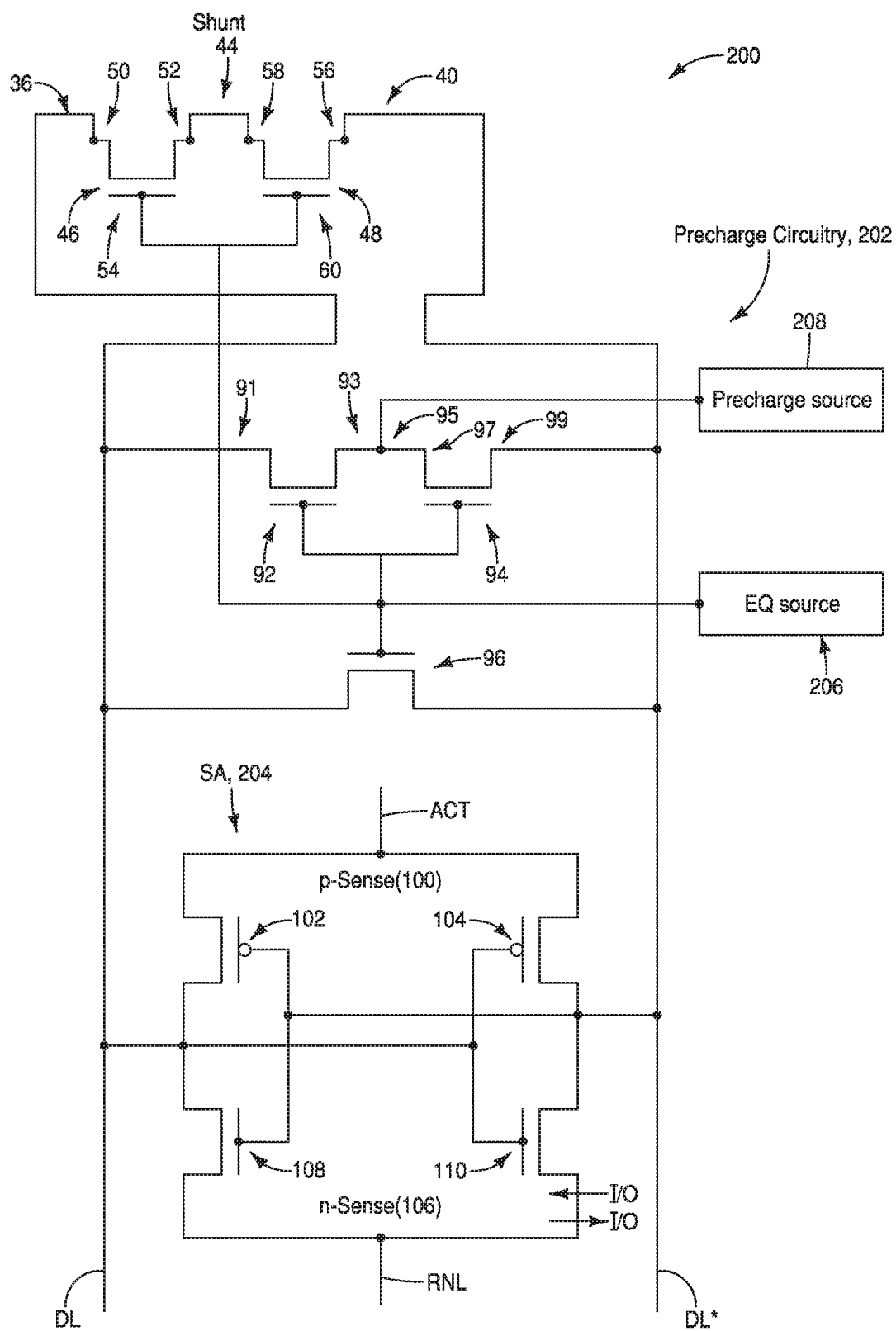
FIG. 8 is a diagrammatic schematic diagram of an example circuit arrangement comprising an example SENSE AMPLIFIER circuit configuration and an example PRECHARGE circuit configuration.
Figure 9:
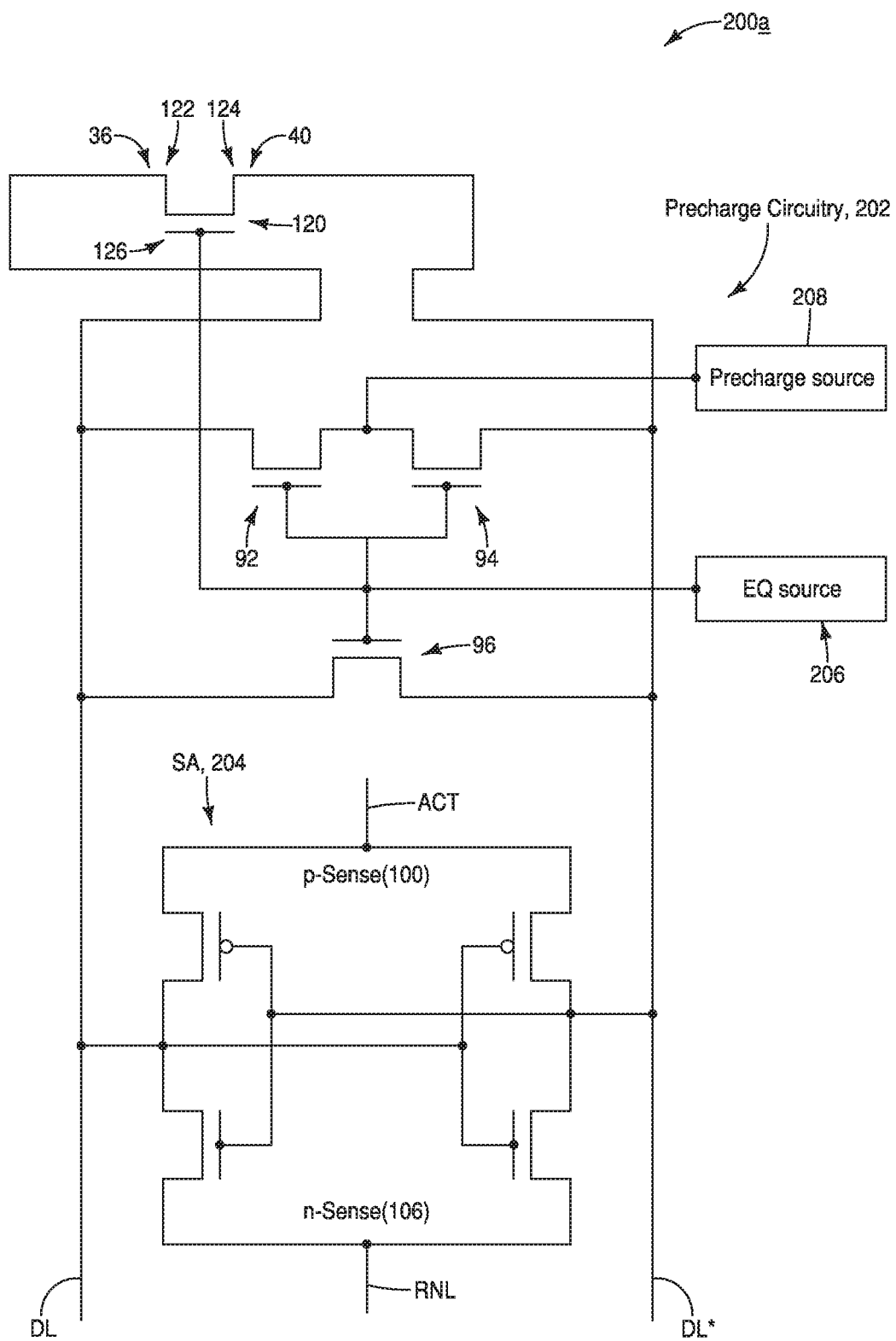
FIG. 9 is a diagrammatic schematic diagram of an example circuit arrangement comprising an example SENSE AMPLIFIER circuit configuration and an example PRECHARGE circuit configuration.

The even first digit lines D0 and D2 are comparatively coupled with the even second digit lines D0* and D2* through the first SENSE AMPLIFIER circuitry 26 (SA-E); and the odd first digit line D1 is comparatively coupled with the odd second digit line D1* through the second SENSE AMPLIFIER circuitry 28 (SA-O). For purposes of understanding this disclosure and the claims that follow, a first digit line is "comparatively coupled" with a second digit line through a SENSE AMPLIFIER circuitry if the SENSE AMPLIFIER circuitry is configured to compare electrical properties (e.g., voltage) of the first and second digit lines with one another. FIGS. 8 and 9 (discussed below) show example SENSE AMPLIFIER circuitry, and shows an example application in which digit lines are comparatively coupled through the example SENSE AMPLIFIER circuitry.

Two digit lines which are comparatively coupled with one another through SENSE AMPLIFIER circuitry may be considered to be complementary to one another. For instance, the digit lines D0 and D0* are complementary to one another, as are the digit lines D1 and D1*. In some embodiments, complementary digit lines may be considered to form a complementary digit line pair. Accordingly, the digit lines D0 and D0* may be considered to form a first complementary pair, and the digit lines D1 and D1* may be considered to form a second complementary pair.

In the illustrated embodiment of FIG. 4, the digit lines D0, D0*, D1, D1*, D2 and D2* are all vertically displaced relative to the first and second SENSE AMPLIFIER circuitries SA-E and SA-0. Also, the digit lines D0, D0*, D1, D1*, D2 and D2* are all laterally displaced relative to one another.

Referring still to FIG. 4, wordlines 32 extend along the first and second memory arrays (ARRAY-1 and ARRAY-2).

Each of the first memory cells 20a within the first memory array (ARRAY-1) is uniquely addressed by one of the digit lines extending along the first memory array (e.g., one of the digit lines D0, D1 and D2), and one of the wordlines 32. Similarly, each of the memory cells 20b within the second memory array (ARRAY-2) is uniquely addressed by one of the digit lines extending along the second memory array (e.g., one of the digit lines D0*, D1* and D2*), and one of the wordlines 32. In some embodiments, the digit lines along the first memory array (ARRAY-1) may be referred to as a first set of digit lines, and the digit lines along the second memory (ARRAY-2) may be referred to as a second set of digit lines.

An advantage of the configuration of FIG. 4 is that all of the SENSE AMPLIFIER circuitry and all of the WORDLINE DRIVER circuitry is provided directly under the memory arrays (ARRAY-1 and ARRAY-2), which may enable tight packing of the memory arrays across a semiconductor substrate; or in other words, which may conserve valuable semiconductor real estate as compared to conventional configurations in which at least some of the SENSE AMPLIFIER circuitry and/or at least some of the WORDLINE DRIVER circuitry is not directly under a memory array. The vertical stacking of regions of the memory arrays (ARRAY-1 and ARRAY-2) may further conserve valuable semiconductor real estate.

Figure 5:
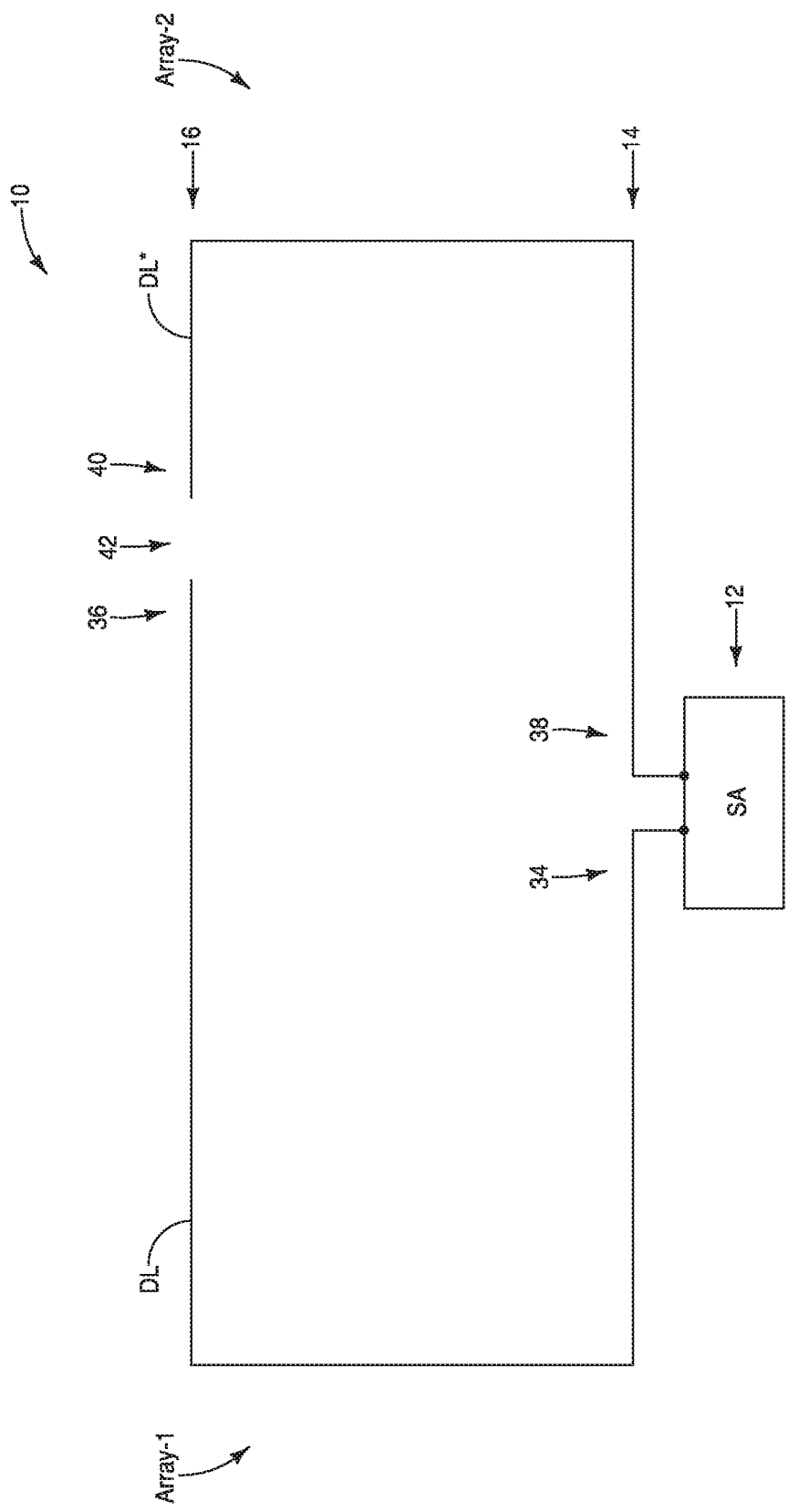
FIG. 5 is a diagrammatic side view of a layout of complementary digit lines within the example decks of FIG. 4.

FIG. 5 shows a region of the integrated assembly 10 of FIG. 4, and diagrammatically illustrates a complementary pair of digit lines DL and DL*. Such complementary pair may correspond to any of the paired digit lines of FIG. 4; such as, for example, the digit lines DL0 and DL0*, the digit lines DL1 and DL1*, etc.

The digit lines DL and DL* are comparatively coupled to one another through a SENSE AMPLIFIER circuitry (SA). The SENSE AMPLIFIER circuitry is shown to be along the base 12, and the digit lines DL and DL* are shown to have regions along the first and second decks 14 and 16. The digit line DL may be considered to be a first digit line which is associated with the first memory array (ARRAY-1), and the digit line DL* may be considered to be a second digit line which is associated with the second memory array (ARRAY-2).

The digit line DL may be considered to have a first end region (or first region) 34 which is proximate to the SENSE AMPLIFIER circuitry, and to have a second end region (or second region) 36 which is distal from the SENSE AMPLIFIER circuitry. Similarly, the digit line DL* may be considered to have a first end region (or first region) 38 which is proximate to the SENSE AMPLIFIER circuitry, and to have a second end region (or second region) 40 which is distal from the SENSE AMPLIFIER circuitry. In some embodiments, the regions 34, 36, 38 and 40 may be referred to as first, second, third and fourth end regions, respectively. In some embodiments, the regions 36 and 40 may be referred to as first and second regions, respectively; with such first and second regions being associated with the first and second digit lines DL and DL*, respectively.

The distal regions 36 and 40 are spaced from one another by an intervening gap 42. An advantage of the configuration of FIG. 5 is that the complement array digit lines DL and DL* wrap along the decks 14 and 16 such that the distal ends 36 and 40 are configured to be near one another. Some embodiments take advantage of the proximity of the distal ends 36 and 40 to enable coupling of such ends during a PRECHARGE operation to thereby speed the PRECHARGE operation as compared to an analogous operation in which the ends 36 and 40 are not coupled to one another.

Figure 6:
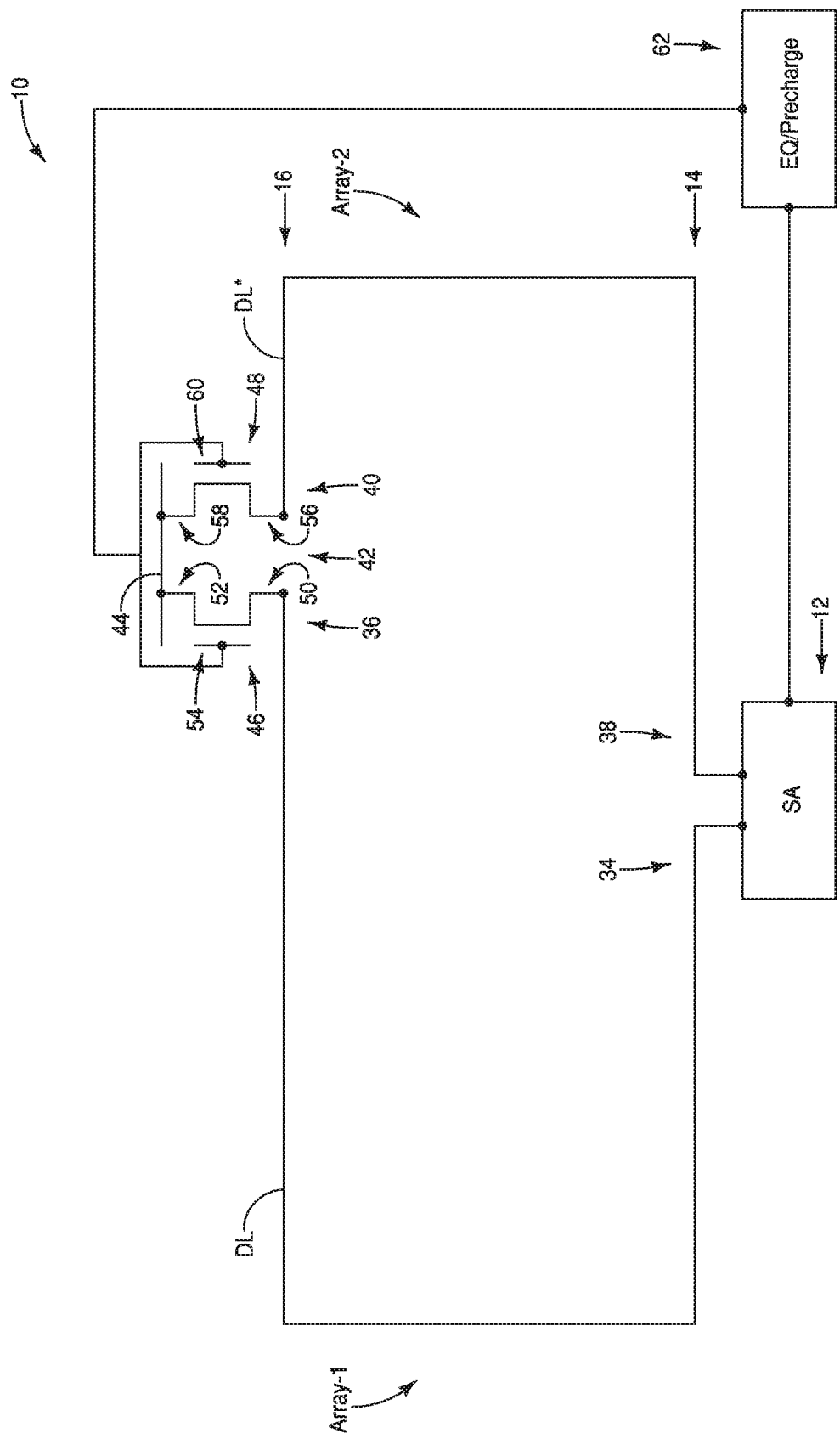
FIG. 6 is a diagrammatic side view of a layout of complementary digit lines within the example decks of FIG. 4, and shows an example shunt which may be utilized to couple ends of the digit lines during a PRECHARGE operation.

FIG. 6 shows an embodiment in which the distal ends 36 and 40 may be selectively coupled to one another during a PRECHARGE operation. Specifically, a shunt 44 is provided across the gap 42 and is gatedly coupled to the distal ends 36 and 40 through transistors 46 and 48, respectively. When the term "gated coupling" is utilized herein, such may refer to the controlled coupling/decoupling of the source/drain regions of a transistor that may be induced by electrical activation/deactivation of a gate associated with the transistor. The transistor 46 may be referred to as a first transistor, and the transistor 48 may be referred to as a second transistor.

In some applications, the shunt 44 may be offset from the gap 42 by a suitable distance to provide space for the transistors 46 and 48.

The first transistor 46 includes a pair of source/drain regions 50 and 52, and includes a gate 54. The gate 54 is proximate a channel region (not labeled) between the source/drain regions 50 and 52.

The second transistor 48 includes a pair of source/drain regions 56 and 58, and includes a gate 60. The gate 60 is proximate a channel region (not labeled) between the source/drain regions 56 and 58.

The source/drain regions 50 and 52 may be referred to as first and second source/drain regions of the transistor 46, and similarly the source/drain regions 56 and 58 may be referred to as first and second source/drain regions of the transistor 48. Alternatively, the source/drain regions 50, 52, 56 and 58 may be referred to as first, second, third and fourth source/drain regions, respectively.

The transistor gates 54 and 60 are electrically coupled with circuitry 62. The circuitry 62 may include EQUILIBRATION circuitry, and may be part of PRECHARGE circuitry, and accordingly is referred to as EQ/Precharge. Additional exemplary details regarding the circuitry 62 are described below with reference to FIGS. 8 and 9.

In operation, the circuitry 62 may be utilized to activate the transistor gates 54 and 60 to thereby couple the distal ends 36 and 40 to one another through the shunt 44 during a PRECHARGE operation. Subsequently, the circuitry 62 may be utilized to deactivate the transistor gates 54 and 60, and to thereby decouple the distal ends 36 and 40 from one another after the PRECHARGE operation is completed.

The transistors 46 and 48 may be considered to be examples of equalization transistors which are provided proximate the distal regions 36 and 40.

The shunt 44, together with the transistors 46 and 48, may be considered to be an example of an electrical configuration which may selectively couple the regions 36 and 40 with one another during a PRECHARGE operation.

Figure 7:
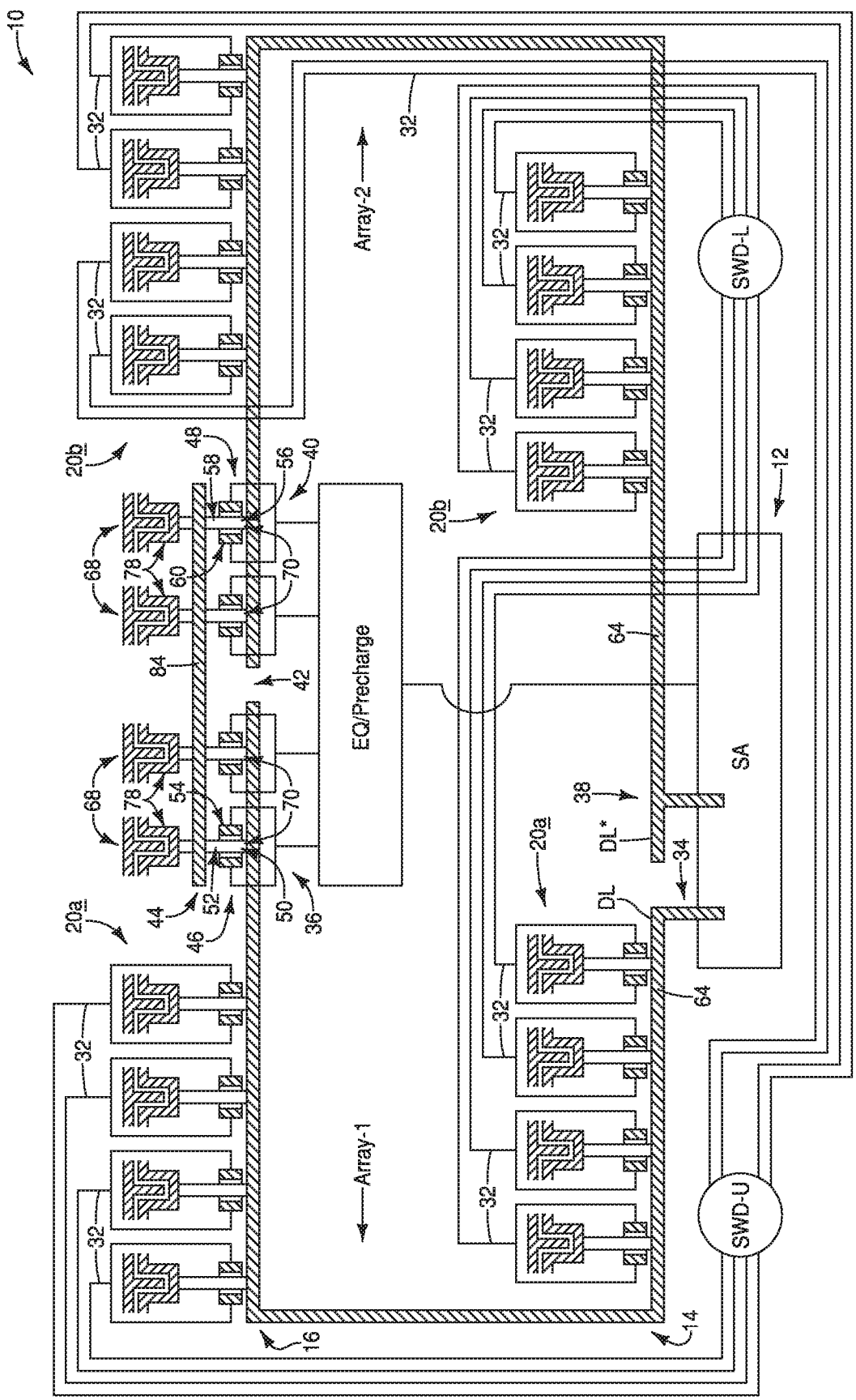
FIG. 7 is a diagrammatic side view of an example multi-deck-assembly showing an example arrangement of example circuit components. The example circuit components include memory cells.

FIG. 7 provides a more detailed view of an example arrangement of the digit lines DL and DL*, and the shunt 44 within the assembly 10. Example memory cells 20a and 20b are shown along elevational levels corresponding to the decks 14 and 16 (with only some of the memory cells being labeled). Each of the memory cells 20a of ARRAY-1 is uniquely addressed by the digit line DL and a wordline 32. Similarly, each of the memory cells 20b of ARRAY-2 is uniquely addressed by the digit line DL* and a wordline 32. The digit lines DL and DL* are comparatively coupled to one another through the SENSE AMPLIFIER circuitry (SA).

The memory cells 20a may be considered to be a first series of memory cells associated with the first digit line DL, and the memory cells 20b may be considered to be a second series of memory cells associated with the second digit line DL*. Some of the memory cells 20a are along the first deck 14, and others are along the second deck 16. Similarly, some of the memory cells 20b are along the first deck 14, and others are along the second deck 16.

The illustrated embodiment includes WORDLINE DRIVER circuitries (SWD-U and SWD-L). The WORDLINE DRIVER circuitries may be supported by the base 12, and may be under the first and second decks 14 and 16, as described above relative to the configuration of FIG. 4. The circuitry SWD-L may be considered to correspond to a first unit of the WORDLINE DRIVER circuitry and is shown to be coupled only with the memory cells 20a and 20b along the first deck (lower deck) 14. The circuitry SWD-U may be considered to correspond to a second unit of the WORDLINE DRIVER circuitry, and is shown to be coupled only with the memory cells 20a and 20b along the second deck (upper deck) 16.

Figure 7A:
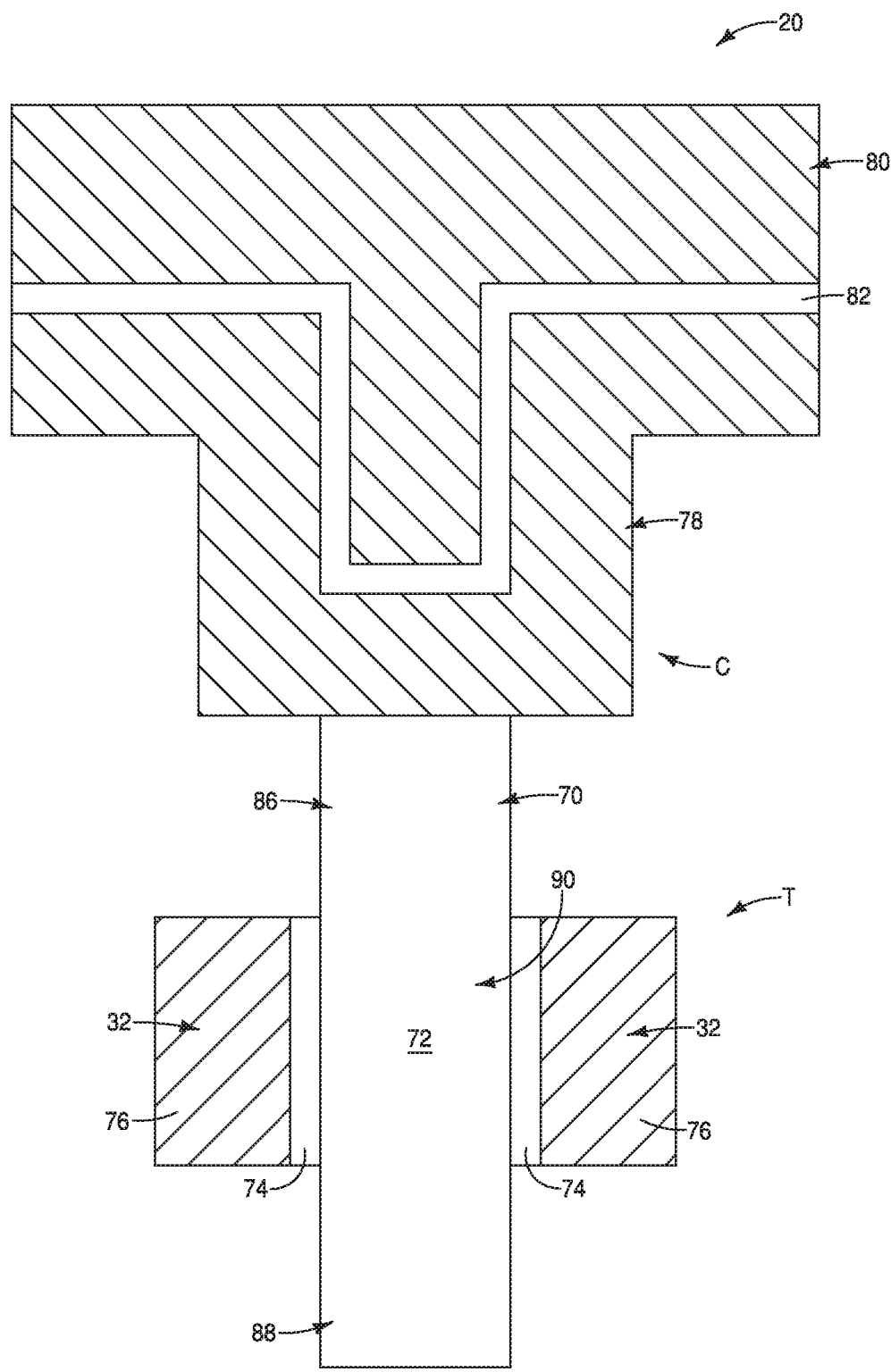
FIG. 7A is a diagrammatic side view of one of the example memory cells of FIG. 7.

An example memory cell 20 is shown in enlarged view in FIG. 7A to simplify the labeling of the components of the memory cell. The memory cell 20 includes a transistor T coupled with a capacitor C. The transistor T comprises a vertically-extending pillar 70 of semiconductor material 72. The semiconductor material 72 may comprise any suitable composition(s); and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15).

Gate dielectric material (insulative material) 74 is along sidewalls of the pillar 70, and conductive gate material 76 is along the gate dielectric material.

The gate dielectric material 74 may comprise any suitable composition(s); and in some embodiments may comprise, consist essentially of, or consist of silicon dioxide.

The conductive gate material 76 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

The conductive gate material 76 forms the transistor gate of the transistor T. The transistor includes a first source/drain region 86 within an upper region of the pillar 70, a second source/drain region 88 within a lower region of the pillar 70, and a channel region 90 between the first and second source/drain regions 86 and 88. In operation, an electrical field generated by voltage within the gate material 76 (i.e., voltage along a wordline 32 coupled with the gate material 76) may gatedly couple the source/drain regions 86 and 88 to one another through the channel region 90. When the term "gated coupling" is utilized herein, such may refer to the controlled coupling/decoupling of source/drain regions of a transistor that may be induced by electrical activation/deactivation of the gate of the transistor.

The capacitor C comprises a first conductive node 78, a second conductive node 80, and an insulative material (capacitor dielectric material) 82 between the first and second conductive nodes.

The first and second conductive nodes 78 and 80 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). The first and second conductive nodes may comprise the same composition as one another, or may comprise different compositions relative to one another.

The insulative material 82 may comprise any suitable composition(s), and in some embodiments may comprise, consist essentially of, or consist of silicon dioxide.

In the shown embodiment, the lower conductive node 78 is configured as an upwardly-opening container. In other embodiments, the lower conductive node may have another suitable shape.

The lower conductive node 78 may be referred to as a storage node, and the upper conductive node 80 may be referred to as a plate electrode. In some embodiments, the plate electrodes may all be coupled to one another.

The capacitor C is an example storage element coupled with the transistor T. In other embodiments, other suitable storage elements may be utilized in place of the capacitor C. Suitable storage-elements may be devices having at least two detectable states; and in some embodiments a suitable storage element may be, for example, a resistive-memory device, a conductive-bridging device, a phase-change-memory (PCM) device, a programmable metallization cell (PMC), etc.

The digit lines DL and DL* of FIG. 7 comprise conductive material 64. Such conductive material may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

The digit line DL includes the first and second end regions 34 and 36 described above with reference to FIG. 6, and similarly the digit line DL* includes the first and second end regions 38 and 40 described above with reference to FIG. 6. The end regions 36 and 40 are distal from the SENSE AMPLIFIER circuitry (SA).

The end regions 36 and 40 are spaced from one another by the gap 42.

The shunt 44 is shown to be a conductive structure vertically offset from the gap 42. The shunt 44 comprises conductive material 84. The conductive material 84 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive material 84 may be a same composition as the conductive material 64 of the digit lines, and in other embodiments the conductive material 84 may be a different composition relative to the conductive material of the digit lines.

The shunt 44 may have any suitable configuration. In the illustrated embodiment of FIG. 7, the shunt is a linear structure (e.g., wire) which extends across the gap 42, and which overlaps portions of the end regions 36 and 40.

The shunt 44 is gatedly coupled to the end region 36 of the digit line DL through a first series of transistors 46, and is gatedly coupled to the end region 40 of the second digit line DL* through a second series of transistors 48. The first series of transistors is shown to comprise two transistors, and the second series of transistors is also shown to comprise two transistors. Generally, the first series of transistors may comprise one or more of the transistors 46, and the second series of transistors may comprise one or more of the transistors 48. The first and second series may comprise the same number of transistors as one another (i.e., an equivalent number of transistors), or may comprise a different number of transistors relative to one another. In alternative embodiments, the configuration comprising the shunt 44 and multiple transistors 46 and 48 may be reduced to a single transistor, as described in more detail below with reference to FIG. 9.

Referring still to FIG. 7, the transistors 46 and 48 are configured identically to the transistor T of FIG. 7A (i.e., the transistor associated with a memory cell 20). Accordingly, the transistors 46 and 48 may be fabricated at the same time, and utilizing the same process steps and materials, as the transistors associated with the memory cells 20a and 20b. Each of the transistors 46 comprises the source/drain regions 50 and 52, and the gate 54; and each of the transistors 48 comprises the source/drain regions 56 and 58, and the gate 60.

The gates 54 and 60 of the transistors 46 and 48 are coupled with the EQUILIBRIUM/PRECHARGE circuitry (EQ/Precharge circuitry) 62 described above with reference to FIG. 6. Also, the EQ/Precharge circuitry 62 is coupled with the SENSE AMPLIFIER circuitry (SA) in the illustrated embodiment of FIG. 7.

It is noted that capacitors 68 are over the transistors 46 and 48, and may be electrically coupled with the upper source/drain regions 52 and 58 of such transistors. The capacitors 68 are identical to the capacitor C described above with reference to FIG. 7A, and may be formed with identical processing as that utilized to form the capacitors of the memory cells. The capacitors 68 may be formed simply because it is easier to form the capacitors 68 during the fabrication of the capacitors of the memory cells 20a and 20b than it is to not form such capacitors over the shunt 44. The capacitors 68 may be inconsequential relative to the final operation of the assembly of FIG. 7. If it is found that the capacitors 68 are problematic, they may be omitted with appropriate processing. Alternatively, there may be applications in which it is found that the capacitors 68 are beneficial. In the illustrated embodiment, the upwardly-opening bottom electrodes 78 of the capacitors 68 are over the shunt 44, and may be electrically coupled to such shunt through the heavily-doped source/drain regions 52 and 58 at the upper portions of the vertical pillars 70.

In some embodiments, the shunt 44 may comprise existing conductive materials of the conventional memory cells 20a, 20b which are merged together, and thus the shunt may be readily incorporated into current architectures without adding additional conductive materials and complex patterning methodologies. For instance, the shunt 44 may comprise lower electrodes of the capacitors 68 merged together, may comprise regions of the pillars 70 merged together, etc.

The SENSE AMPLIFIER circuitry and EQUILIBRIUM/PRECHARGE circuitry of FIG. 7 may comprise any suitable configuration. An example configuration 200 is diagrammatically illustrated in FIG. 8. The example configuration 200 includes SENSE AMPLIFIER circuitry 204 and PRECHARGE circuitry 202.

The SENSE AMPLIFIER circuitry 204 includes a p-sense amplifier 100 comprising a pair of cross-coupled pull-up transistors 102 and 104, and includes an n-sense amplifier 106 comprising a pair of cross-coupled pull-down transistors 108 and 110. The p-sense amplifier 100 is coupled with active pull-up circuitry (labeled ACT), and the n-sense amplifier 106 is coupled with a common node (labeled RNL). The illustrated SENSE AMPLIFIER SA is coupled with the digit lines DL and DL*, or in other words the digit lines DL and DL* are comparatively coupled with one another through the illustrated SENSE AMPLIFIER circuitry. In operation, the amplifiers 100 and 106 may be utilized together to detect the relative signal voltages of DL and DL*, and to drive the higher signal voltage to VCC while driving the lower signal voltage to ground. Also, inputs and outputs associated with the SENSE AMPLIFIER (labeled as I/O) may be utilized for exporting data regarding the relative signal voltages of DL and DL*, and/or for programming memory cells along one or both of DL and DL*.

The PRECHARGE circuitry 202 includes the transistors 46 and 48 adjacent the distal ends 36 and 40 of the digit lines DL and DL*. The transistors 46 and 48 may be considered to be examples of first equalization transistors within the PRECHARGE circuitry 202, with such first equalization transistors being configured to selectively couple the distal ends 36 and 40 of the digit lines DL and DL* with one another during a PRECHARGE operation.

The PRECHARGE circuitry 202 also includes a plurality of second equalization transistors 92, 94 and 96 which are proximate the SENSE AMPLIFIER circuitry 204.

An equalization source voltage (EQ source) 206 is electrically coupled with gates of the equalization transistors 46, 48, 92, 94 and 96. The equalization source voltage 206 may be any suitable voltage which activates gates of the transistors 46, 48, 92, 94 and 96; and in some embodiments may be a voltage of about VCC. In some embodiments, the equilibration source voltage 206 may be considered to be an example of EQUILIBRATION circuitry coupled with the gates 54 and 60 of the transistors 46 and 48 (i.e., coupled with gates of the first equalization transistors), and also coupled with gates of the transistors 92, 94 and 96 (i.e., coupled with gates of the second equalization transistors).

A precharge source voltage (Precharge source) 208 is coupled with a shared source/drain region 95 of the transistors 92 and 94. The precharge source voltage 208 corresponds to a voltage applied to the digit lines DL and DL* during a PRECHARGE operation, and in some embodiments may correspond to a voltage of about VCC/2. The second equalization transistors 92 and 94 may be considered to be configured to gatedly couple the first and second digit lines DL and DL* to the precharge source voltage 208.

In some embodiments, the transistors 92 and 94 may be considered to be third and fourth transistors which couple the first and second digit lines DL and DL* with the precharge voltage source 208. In some embodiments, the third transistor 92 may be considered to comprise source/drain regions 91 and 93, and the fourth transistor 94 may be considered to comprise source/drain regions 97 and 99. The source/drain regions 93 and 97 overlap with one another, and correspond to the shared source/drain region 95. The source/drain regions 91, 93, 97 and 99 may be referred to as fifth, sixth, seventh and eighth source/drain regions, respectively, to distinguish them from the first, second, third and fourth source/drain regions 50, 52, 56 and 58 associated with the transistors 46 and 48.

The configuration of FIG. 8 includes the electrical shunt 44 proximate the regions 36 and 40 of the digit lines DL and DL*, and includes the first and second transistors 46 and 48 which gatedly couple the electrical shunt to the regions 36 and 40 of the digit lines DL and DL*. Accordingly, the configuration of FIG. 8 may be considered to illustrate a pair of the first equalization transistors (with such pair including the transistor 46 and the transistor 48). As described above with reference to FIG. 7, other embodiments may include more than one of the transistors 46 along the region 36 of the digit line DL and/or may include more than one of the transistors 48 along the region 40 of the digit line DL*.

In some embodiments, the shunt 44 and the first equalization transistors 46 and 48 may be replaced with a single equalization transistor, as shown in FIG. 9. Specifically, FIG. 9 shows a configuration 200a analogous to the configuration 200 of FIG. 8, but comprising a single transistor 120 in place of the shunt 44 and transistors 46 and 48. The transistor 120 comprises a first source/drain region 122 coupled with the end 36 of the digit line DL, and comprises a second source/drain region 124 coupled with the and 40 of the digit line DL*. The transistor 120 also comprises a gate 126, with such gate being coupled to the equilibration source voltage 206. As discussed above with reference to FIG. 8, in some embodiments the equilibration source voltage 206 may be considered to be a region of an EQUILIBRATION circuit.

Although the embodiments described herein indicate that there are two memory decks (14, 16) over a base 12, it is to be understood that in other embodiments there may be more than two memory decks over the base.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow. The terms "couple, coupling, coupled, etc." may refer to electrical connections.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly having a first digit line coupled with SENSE AMPLIFIER circuitry. The first digit line has a first region distal from the SENSE AMPLIFIER circuitry. A second digit line is coupled with the SENSE AMPLIFIER circuitry and has a second region distal from the SENSE AMPLIFIER circuitry. PRECHARGE circuitry includes one or more first equalization transistors proximate the first and second regions, and includes a second equalization transistor proximate the SENSE AMPLIFIER circuitry.

Some embodiments include an integrated assembly having a first digit line coupled with SENSE AMPLIFIER circuitry. The first digit line has a first region distal from the SENSE AMPLIFIER circuitry. A second digit line is coupled with the SENSE AMPLIFIER circuitry and has a second region distal from the SENSE AMPLIFIER circuitry. PRECHARGE circuitry includes an electrical connection coupling the first and second regions to one another.

Some embodiments include an integrated assembly comprising a base containing SENSE AMPLIFIER circuitry. A first deck is over the base. The first deck comprises a first portion of a first array of first memory cells, and comprises a first portion of a second array of second memory cells. A second deck is over the first deck. The second deck comprises a second portion of the first array of the first memory cells, and comprises a second portion of the second array of the second memory cells. A first digit line is associated with the first array. The first digit line has a first end region and has an opposing second end region. A second digit line is associated with the second array. The second digit line has a third end region and has an opposing fourth end region. The first and third end regions are coupled with SENSE AMPLIFIER circuitry. The second and fourth end regions are gatedly coupled with an electrical shunt.

Some embodiments include an integrated assembly comprising a base containing SENSE AMPLIFIER circuitry. A first deck is over the base. The first deck comprises a first portion of a first array of first memory cells, and comprises a first portion of a second array of second memory cells. A second deck is over the first deck. The second deck comprises a second portion of the first array of the first memory cells, and comprises a second portion of the second array of the second memory cells. A first digit line is associated with the first array. The first digit line has a first end region and has an opposing second end region. A second digit line is associated with the second array. The second digit line has a third end region and has an opposing fourth end region. The first and third end regions are coupled with SENSE AMPLIFIER circuitry. The second and fourth end regions are spaced from one another by an intervening gap, and are gatedly coupled with a conductive structure which is over the second and fourth ends and which extends across the intervening gap.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An integrated assembly, comprising:
   a first digit line coupled with SENSE AMPLIFIER circuitry and having a first region distal from the SENSE AMPLIFIER circuitry;
   a second digit line coupled with the SENSE AMPLIFIER circuitry and having a second region distal from the SENSE AMPLIFIER circuitry; and
   PRECHARGE circuitry which includes one or more first equalization transistors proximate and gatedly coupling the first and second regions to one another through an electrical shunt, and which includes a second equalization transistor proximate the SENSE AMPLIFIER circuitry, the electrical shunt comprising a conductive structure that entirely spans a gap between the first and second regions.

2. The integrated assembly of claim 1 wherein the second equalization transistor is one of a pair of second equalization transistors which gatedly couple the first and second digit lines to a PRECHARGE voltage source.

3. An integrated assembly, comprising:
   a first digit line coupled with SENSE AMPLIFIER circuitry and having a first region distal from the SENSE AMPLIFIER circuitry;
   a second digit line coupled with the SENSE AMPLIFIER circuitry and having a second region distal from the SENSE AMPLIFIER circuitry; and
   PRECHARGE circuitry comprising three or more equalization transistors and which includes an electrical connection coupling the first and second regions to one another through an electrical shunt, the electrical shunt comprising a conductive structure that entirely spans a gap between the first and second regions.

4. The integrated assembly of claim 3 wherein the electrical shunt is offset from the first and second regions.

5. The integrated assembly of claim 4 wherein the PRECHARGE circuitry includes:
   a first transistor gatedly coupling the first region to the electrical shunt;
   a second transistor gatedly coupling the second region to the electrical shunt; and
   EQUILIBRATION circuitry coupled with gates of the first and second transistors.

6. The integrated assembly of claim 5 wherein the PRECHARGE circuitry further includes:
   a third transistor gatedly coupling the first digit line with a PRECHARGE voltage source;
   a fourth transistor gatedly coupling the second digit line with the PRECHARGE voltage source; and
   the EQUILIBRATION circuitry coupled with gates of the third and fourth transistors.

7. The integrated assembly of claim 6 wherein the third and fourth transistors share a source/drain region, and wherein said shared source/drain region is coupled with the PRECHARGE voltage source.

8. An integrated assembly, comprising:
   a base comprising SENSE AMPLIFIER circuitry;
   a first deck over the base; the first deck comprising a first portion of a first array of first memory cells, and comprising a first portion of a second array of second memory cells;
   a second deck over the first deck; the second deck comprising a second portion of the first array of the first memory cells, and comprising a second portion of the second array of the second memory cells;
   a first digit line associated with the first array, the first digit line having a first end region and an opposing second end region;
   a second digit line associated with the second array, the second digit line having a third end region and an opposing fourth end region;
   the first and third end regions being coupled with SENSE AMPLIFIER circuitry; and
   the second and fourth end regions being gatedly coupled with an electrical shunt, the shunt being associated with three or more equalization transistors.

9. The integrated assembly of claim 8 wherein the gated coupling of the second end with the electrical shunt is through a first transistor and the gated coupling of the fourth end with the electrical shunt is through a second transistor; and wherein gates of the first and second transistors are coupled to one another and to EQUILIBRATION circuitry.

10. An integrated assembly, comprising:
    a base comprising SENSE AMPLIFIER circuitry;
    a first deck over the base; the first deck comprising a first portion of a first array of first memory cells, and comprising a first portion of a second array of second memory cells;

a second deck over the first deck; the second deck comprising a second portion of the first array of the first memory cells, and comprising a second portion of the second array of the second memory cells;
a first digit line associated with the first array, the first digit line having a first end region and an opposing second end region;
a second digit line associated with the second array, the second digit line having a third end region and an opposing fourth end region;
the first and third end regions being coupled with SENSE AMPLIFIER circuitry; and
the second and fourth end regions being gatedly coupled with an electrical shunt, the gated coupling of the second end with the electrical shunt being through a first transistor and the gated coupling of the fourth end with the electrical shunt being through a second transistor; and wherein gates of the first and second transistors are coupled to one another and to EQUILIBRATION circuitry; wherein the first transistor has first and second source/drain regions and the second transistor has third and fourth source/drain regions; wherein the first source/drain region is coupled with the second end region, and the third source/drain region is coupled with the fourth end region; and wherein the second source/drain region is coupled with the shunt, and the fourth source/drain region is coupled with the shunt.

11. The integrated assembly of claim 10 wherein the second and fourth source/drain regions are also coupled with bottom electrodes of capacitors.

12. The integrated assembly of claim 11 wherein the bottom electrode are configured as upwardly-opening containers.

13. The integrated assembly of claim 11 wherein the bottom electrodes are over the shunt.

14. The integrated assembly of claim 10 wherein a PRECHARGE circuit includes the first and second transistors and the shunt, and wherein the PRECHARGE circuit further includes:
a third transistor proximate the first digit line; the third transistor having a fifth source/drain and a sixth source/drain region; the fifth source/drain region being coupled with the first digit line; the third transistor having a gate which gatedly couples the fifth and sixth source/drain regions with one another;
a fourth transistor proximate the second digit line; the fourth transistor having a seventh source/drain and an eighth source/drain region; the eighth source/drain region being coupled with the second digit line; the seventh source/drain region being coupled with the sixth source/drain region; the fourth transistor having a gate which gatedly couples the seventh and eighth source/drain regions with one another; and
the gates of the third and fourth transistors being coupled with the EQUILIBRATION circuitry.

15. The integrated assembly of claim 14 comprising a PRECHARGE voltage source coupled with the sixth and seventh source/drain regions.

16. An integrated assembly, comprising:
a base comprising SENSE AMPLIFIER circuitry;
a first deck over the base; the first deck comprising a first portion of a first array of first memory cells, and comprising a first portion of a second array of second memory cells;
a second deck over the first deck; the second deck comprising a second portion of the first array of the first memory cells, and comprising a second portion of the second array of the second memory cells;
a first digit line associated with the first array, the first digit line having a first end region and an opposing second end region;
a second digit line associated with the second array, the second digit line having a third end region and an opposing fourth end region;
the first and third end regions being coupled with SENSE AMPLIFIER circuitry; and
the second and fourth end regions being spaced from one another by an intervening gap, and being gatedly coupled with one another through a conductive structure which is over the second and fourth ends and which extends across the intervening gap, at least three transistors being disposed proximate the gap and being coupled to the conductive structure.

17. The integrated assembly of claim 16 wherein the conductive structure is configured as a wire extending across the gap.

18. The integrated assembly of claim 16 wherein the gated coupling of the second end with the conductive structure is through a first transistor and the gated coupling of the fourth end with the conductive structure is through a second transistor; and wherein gates of the first and second transistors are coupled to one another and to EQUILIBRATION circuitry.

19. The integrated assembly of claim 18 wherein the first transistor is one of many transistors gatedly coupling the second end with the conductive structure, and wherein the second transistor is one of many transistors gatedly coupling the fourth end with the conductive structure.

20. The integrated assembly of claim 19 wherein the number of transistors gatedly coupling the second end with the conductive structure is equivalent to the number of transistors gatedly coupling the fourth end with the conductive structure.

21. The integrated assembly of claim 19 wherein the number of transistors gatedly coupling the second end with the conductive structure is not equivalent to the number of transistors gatedly coupling the fourth end with the conductive structure.

22. The integrated assembly of claim 18 wherein the first transistor has first and second source/drain regions and the second transistor has third and fourth source/drain regions; wherein the first source/drain region is coupled with the second end region, and the third source/drain region is coupled with the fourth end region; and wherein the second source/drain region is coupled with the conductive structure, and the fourth source/drain region is coupled with the conductive structure.

23. The integrated assembly of claim 22 wherein the second and fourth source/drain regions are also coupled with bottom electrodes of capacitors.

24. The integrated assembly of claim 23 wherein the bottom electrode are configured as upwardly-opening containers.

25. The integrated assembly of claim 24 wherein the bottom electrodes are over the conductive structure.

26. The integrated assembly of claim 18 wherein a PRECHARGE circuit includes the first and second transistors and the shunt, and wherein the PRECHARGE circuit further includes:
a third transistor proximate the first digit line; the third transistor having a fifth source/drain and a sixth source/drain region; the fifth source/drain region being coupled with the first digit line; the third transistor having a gate which gatedly couples the fifth and sixth source/drain regions with one another;

a fourth transistor proximate the second digit line; the fourth transistor having a seventh source/drain and an eighth source/drain region; the eighth source/drain region being coupled with the second digit line; the seventh source/drain region being coupled with the sixth source/drain region; the fourth transistor having a gate which gatedly couples the seventh and eighth source/drain regions with one another; and the gates of the third and fourth transistors being coupled with the EQUILIBRATION circuitry.

27. The integrated assembly of claim 26 comprising a PRECHARGE voltage source coupled with the sixth and seventh source/drain regions.

28. An integrated assembly, comprising:

a base comprising SENSE AMPLIFIER circuitry;

a first deck over the base; the first deck comprising a first portion of a first array of first memory cells, and comprising a first portion of a second array of second memory cells;

a second deck over the first deck; the second deck comprising a second portion of the first array of the first memory cells, and comprising a second portion of the second array of the second memory cells;

a first digit line associated with the first array, the first digit line having a first end region and an opposing second end region;

a second digit line associated with the second array, the second digit line having a third end region and an opposing fourth end region;

the first and third end regions being coupled with SENSE AMPLIFIER circuitry; and the second and fourth end regions being spaced from one another by an intervening gap, and being gatedly coupled with one another through a conductive structure which is over the second and fourth ends and which extends across the intervening gap; wherein a first series of memory cells is associated with the first digit line; some of the memory cells of the first series being along the first deck and others of the memory cells of the first series being along the second deck; wherein a second series of memory cells is associated with the second digit line; some of the memory cells of the second series being along the first deck and others of the memory cells of the second series being along the second deck; and comprising WORDLINE DRIVER circuitry supported by the base and being under the first and second decks;

the WORDLINE DRIVER circuitry including a first unit which is coupled only with the memory cells of the first and second series along the first deck, and including a second unit which is coupled only with the memory cells of the first and second series along the second deck.

* * * * *